(12) United States Patent
Erickson et al.

(10) Patent No.: US 9,443,767 B2
(45) Date of Patent: Sep. 13, 2016

(54) STRUCTURE FOR METAL OXIDE SEMICONDUCTOR CAPACITOR

(71) Applicant: International Business Machines Corporation, Armonk, NY (US)

(72) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/571,700

(22) Filed: Dec. 16, 2014

(65) Prior Publication Data

US 2016/0172249 A1 Jun. 16, 2016

Related U.S. Application Data

(63) Continuation of application No. 14/568,531, filed on Dec. 12, 2014.

(51) Int. Cl.
| | |
|---|---|
| *H01L 27/15* | (2006.01) |
| *H01L 21/8234* | (2006.01) |
| *H01L 21/28* | (2006.01) |
| *H01L 21/311* | (2006.01) |

(Continued)

(52) U.S. Cl.
CPC . *H01L 21/823431* (2013.01); *H01L 21/28114* (2013.01); *H01L 21/31053* (2013.01); *H01L 21/31144* (2013.01); *H01L 21/823437* (2013.01); *H01L 21/823475* (2013.01); *H01L 23/5222* (2013.01)

(58) Field of Classification Search
CPC .......... H01L 2924/01079; H01L 2924/01015; H01L 27/156; H01L 25/0753
USPC .......................................................... 438/28
See application file for complete search history.

(56) References Cited

U.S. PATENT DOCUMENTS

| | | |
|---|---|---|
| 6,947,275 B1 | 9/2005 | Anderson et al. |
| 6,995,412 B2 | 2/2006 | Fried et al. |
| 7,683,417 B2 | 3/2010 | Xiong et al. |

(Continued)

OTHER PUBLICATIONS

Erickson et al., "Design Structure for Metal Oxide Semiconductor Capacitor", U.S. Appl. No. 14/568,531, filed Dec. 12, 2014.

(Continued)

*Primary Examiner* — Monica D Harrison
(74) *Attorney, Agent, or Firm* — Wood, Herron & Evans, LLP; Robert R. Williams

(57) ABSTRACT

A design structure for a semiconductor structure is disclosed. The semiconductor structure can include a substrate, a set of semiconductor fins positioned on the substrate and positioned approximately parallel lengthwise to one another, a first gate layer and a second gate layer deposited on the substrate and on the set of semiconductor fins approximately perpendicular lengthwise to the set of semiconductor fins. The semiconductor structure can include an interconnect layer deposited on the substrate and on the set of semiconductor fins approximately perpendicular lengthwise to the set of semiconductor fins. The interconnect layer can be positioned between the first gate layer and the second gate layer at a first interconnect distance from the first gate layer and a second interconnect distance from the second gate layer.

9 Claims, 11 Drawing Sheets

(51) Int. Cl.
  *H01L 23/522* (2006.01)
  *H01L 21/3105* (2006.01)

(56) References Cited

U.S. PATENT DOCUMENTS

| | | |
|---|---|---|
| 8,420,476 B2 | 4/2013 | Booth, Jr. et al. |
| 8,513,723 B2 | 8/2013 | Booth, Jr. et al. |
| 8,581,320 B1 | 11/2013 | Cheng et al. |
| 8,748,989 B2 | 6/2014 | Lin et al. |
| 9,024,387 B2 * | 5/2015 | Erickson ............... H01L 21/845 257/368 |
| 2007/0018239 A1 | 1/2007 | Chen et al. |
| 2008/0237678 A1 | 10/2008 | Datta et al. |
| 2011/0298025 A1 | 12/2011 | Haensch et al. |
| 2014/0042547 A1 | 2/2014 | Khakifirooz et al. |

OTHER PUBLICATIONS

List of IBM Patents or Patent Applications Treated as Related.

\* cited by examiner

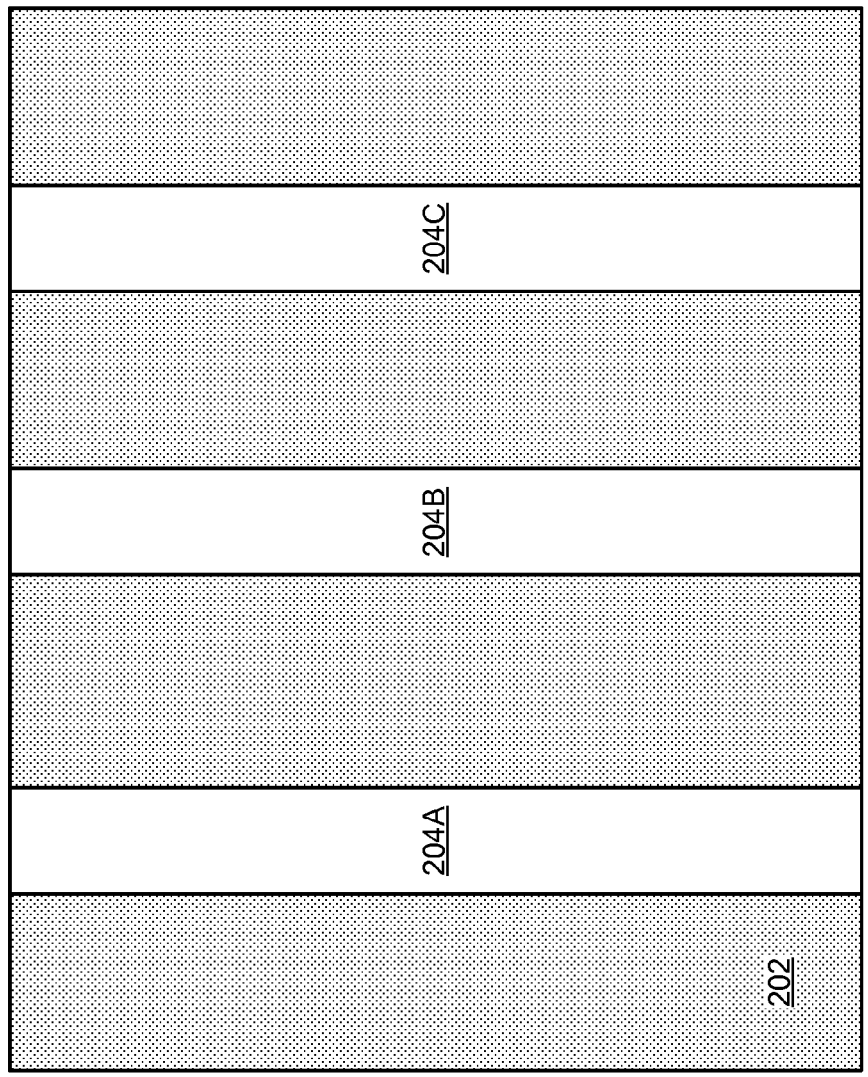

STRUCTURE FOR METAL OXIDE SEMICONDUCTOR CAPACITOR

CROSS-REFERENCE TO RELATED APPLICATIONS

This application is a continuation of U.S. patent application Ser. No. 14/568,531 filed Dec. 12, 2014, now U.S. Pat. No. 9,245,884 issued Jan. 26, 2016.

BACKGROUND

The present disclosure relates to a design structure, and more specifically, to a design structure for a set of semiconductor fins with gate layers and an interconnect layer.

In some instances, semiconductor device technology nodes, such as 14 nanometer (nm), 20 nm, 22 nm, and other technology nodes can place various restrictions on semiconductor design. Further, in some instances, semiconductor manufacturing can result in "padding" structures. Padding structures can be semiconductor structures not made for function but as aids for patterning devices. In some instances, the area associated with padding can be significant, utilizing several percent of a silicon area on a die. Further, in some instances, the smaller the semiconductor device, the greater the number of padding (e.g. dummy devices) required on a die relative to number of functional devices.

SUMMARY

According to embodiments of the present disclosure, a semiconductor structure is disclosed. The semiconductor structure can include a substrate, and a set of semiconductor fins. The set of semiconductor fins can be positioned on the substrate and positioned approximately parallel lengthwise to one another. The semiconductor structure can include a first gate layer having a first gate width, the first gate layer deposited on the substrate and on the set of semiconductor fins approximately perpendicular lengthwise to the set of semiconductor fins, the first gate layer directly contacting sidewalls of each of the set of semiconductor fins. The semiconductor structure can include a second gate layer having a second gate width, the second gate layer deposited on the substrate and on the set of semiconductor fins approximately perpendicular lengthwise to the set of semiconductor fins, the second gate layer directly contacting sidewalls of each of the set of semiconductor fins, the first gate layer and the second gate layer positioned approximately parallel with one another and separated by a gate distance. The semiconductor structure can include an interconnect layer deposited on the substrate and on the set of semiconductor fins approximately perpendicular lengthwise to the set of semiconductor fins, the interconnect layer directly contacting sidewalls of each of the set of semiconductor fins, the interconnect layer positioned between the first gate layer and the second gate layer at a first interconnect distance from the first gate layer and a second interconnect distance from the second gate layer.

Embodiments of the present disclosure are directed towards A method of forming a semiconductor structure. The method can include forming a set of semiconductor fins on a substrate. The set of semiconductor fins can be positioned approximately parallel lengthwise to one another, each of the set of semiconductor fins separated from one another by a fin distance. The method can include forming a first gate layer having a first gate width, the first gate layer deposited on the substrate and on the set of semiconductor fins approximately perpendicular lengthwise to the set of semiconductor fins, the first gate layer directly contacting sidewalls of each of the set of semiconductor fins. The method can include forming a second gate layer having a second gate width, the second gate layer deposited on the substrate and on the set of semiconductor fins approximately perpendicular lengthwise to the set of semiconductor fins, the second gate layer directly contacting sidewalls of each of the set of semiconductor fins. The first gate layer and the second gate layer can be positioned approximately parallel with one another and separated by a gate distance. The method can include forming an interconnect layer deposited on the substrate and on the set of semiconductor fins approximately perpendicular lengthwise to the set of semiconductor fins. The interconnect layer can directly contact sidewalls of each of the set of semiconductor fins. The interconnect layer can be positioned between the first gate layer and the second gate layer at a first interconnect distance from the first gate layer and a second interconnect distance from the second gate layer.

Embodiments of the present disclosure are directed towards a design structure readable by a machine used in design, manufacture, or simulation of an integrated circuit. The design structure can include a substrate, and a set of semiconductor fins. The set of semiconductor fins can be positioned on the substrate and positioned approximately parallel lengthwise to one another. The design structure can include a first gate layer having a first gate width, the first gate layer deposited on the substrate and on the set of semiconductor fins approximately perpendicular lengthwise to the set of semiconductor fins, the first gate layer directly contacting sidewalls of each of the set of semiconductor fins. The design structure can include a second gate layer having a second gate width, the second gate layer deposited on the substrate and on the set of semiconductor fins approximately perpendicular lengthwise to the set of semiconductor fins, the second gate layer directly contacting sidewalls of each of the set of semiconductor fins, the first gate layer and the second gate layer positioned approximately parallel with one another and separated by a gate distance. The design structure can include an interconnect layer deposited on the substrate and on the set of semiconductor fins approximately perpendicular lengthwise to the set of semiconductor fins, the interconnect layer directly contacting sidewalls of each of the set of semiconductor fins, the interconnect layer positioned between the first gate layer and the second gate layer at a first interconnect distance from the first gate layer and a second interconnect distance from the second gate layer.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIGS. 2A-2F depicts a top down views of various stages of formation of a semiconductor structure, according to embodiments of the present disclosure.

Figure 1A:
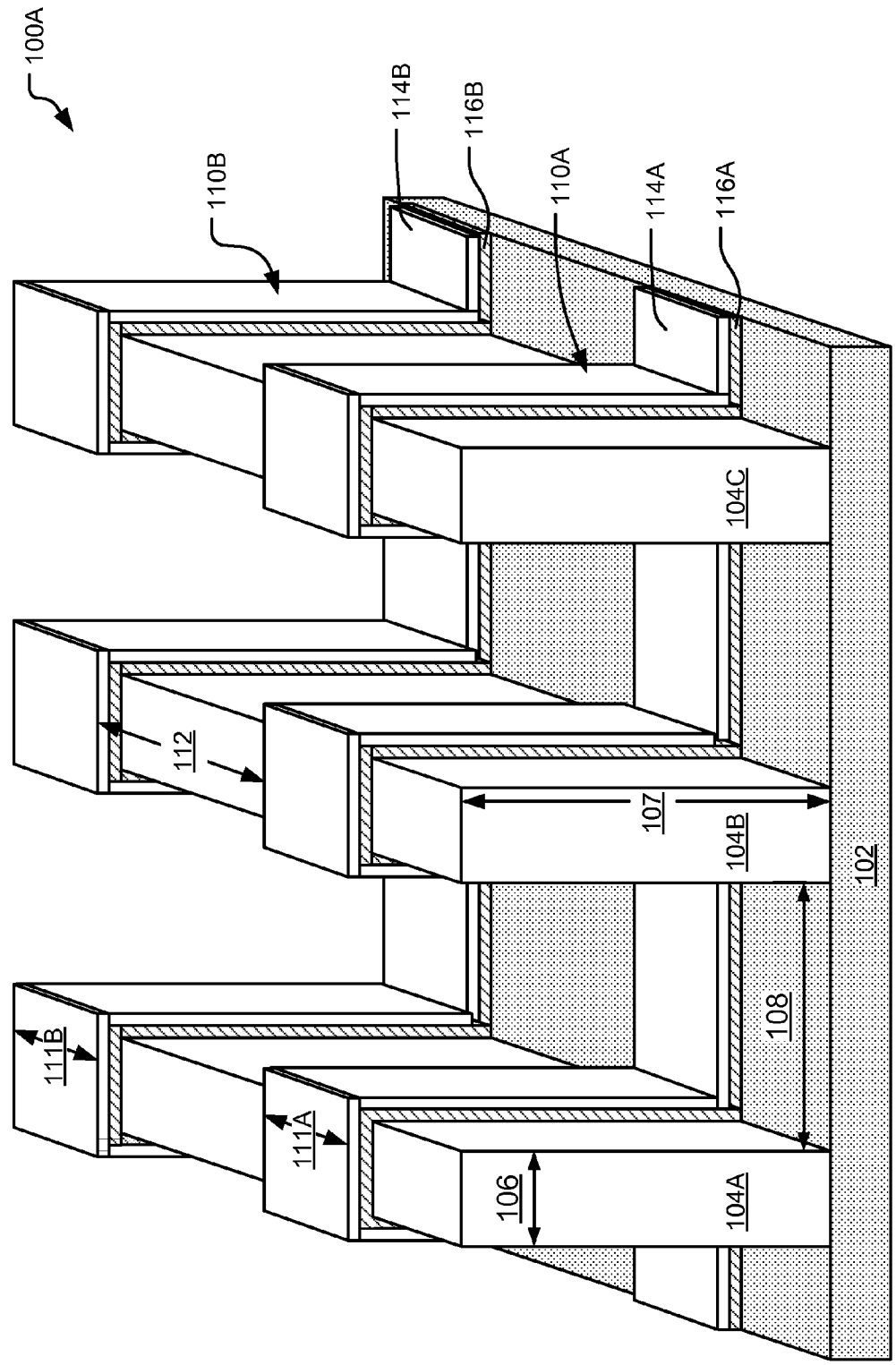
FIGS. 1A-1C depicts perspective views of various semiconductor structures, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to semiconductor devices, more particular aspects relate to a semiconductor structure including a set of semiconductor fins with gate layers and an interconnect layer. While the present disclosure is not necessarily limited to such applications, various aspects of the disclosure may be appreciated through a discussion of various examples using this context.

Embodiments of the present disclosure are directed to a semiconductor structure. The semiconductor structure can include a set of semiconductor fins positioned on a substrate. The set of semiconductor fins can be positioned approximately parallel to one another lengthwise. In embodiments, each of the set of semiconductor fins are separated from one another by a fin distance. The semiconductor structure can include a first gate layer and a second gate layer. The first and second gate layers can be deposited on the substrate and on the set of semiconductor fins. The first and second gate layers can be deposited such that they are positioned approximately perpendicular to the set of semiconductor fins lengthwise. In embodiments, the first and second gate layers directly contact sidewalls of each of the set of semiconductor fins. In embodiments, the first gate layer and the second gate layer are positioned approximately parallel with one another and separated by a gate distance.

In embodiments, the semiconductor structure can include an interconnect layer deposited on the substrate and on the set of semiconductor fins approximately perpendicular lengthwise to the set of semiconductor fins. The interconnect layer can be deposited such that it directly contacts sidewalls of each of the set of semiconductor fins. In embodiments, the interconnect layer is positioned between the first gate layer and the second gate layer at a first interconnect distance from the first gate layer and a second interconnect distance from the second gate layer.

In some instances, semiconductor device technology nodes, such as 14 nanometer (nm), 20 nm, and 22 nm can place various restrictions on semiconductor design. For example, in the 20 nm technology node, capacitors designed with active regions significantly larger than a minimum transistor width can be difficult to implement. Additionally, in the 20 nm technology node, capacitors designed with active regions significantly larger than transistor gate length minimums can be difficult to implement.

Embodiments of the present disclosure are directed towards a semiconductor structure that can enhance the capacitive density of various semiconductor devices, such as a logic die or other suitable semiconductor device. In embodiments increasing capacitive density can include increasing density of decoupling capacitors, such as capacitors used to suppress coupling via power supply connections (e.g. power supply decoupling). In some embodiments, increasing capacitive density can include increasing density of signal capacitors. In embodiments increasing density of signal capacitors can improve design restrictions of the 14 nanometer (nm), 20 nm, and 22 nm technology nodes, as described herein.

Embodiments of the present disclosure are directed towards a semiconductor structure that can be constructed using "padding" structures. In embodiments, padding structures are semiconductor structures not made for function but as aids for patterning devices. In some instances, semiconductor device manufacturing techniques can result in padding areas on a wafer/die that includes dummy devices (e.g. non-functional devices) adjacent to one or more functional semiconductor devices. For example, when forming a transistor, a number of dummy transistors would be constructed adjacent to the formed transistor. In some instances, the area associated with padding can be significant, utilizing several percent of a silicon area on a die. For example, in some instances, 15 total devices could be required to get a single functional transistor (14 dummy transistors and 1 functional transistor). Further, in some instances, the smaller the semiconductor device, the greater the number of padding (e.g. dummy devices) required on a die relative to number of functional devices.

Thus, in embodiments, the semiconductor structure can utilize the padding area for power supply decoupling and/or dedicated signal capacitance. While padding structures can be used to construct the semiconductor structure, in some embodiments the semiconductor structure can be constructed from other suitable structures.

Additionally, embodiments of the present disclosure can use several FEOL design levels as well as a first metal manufacturing approach to make a relatively high density and low resistance capacitor structure.

Referring now to FIG. 1A a perspective view of a semiconductor structure 100A can be seen according to embodiments of the present disclosure. The semiconductor structure 100A can include a substrate 102, a set of semiconductor fins 104A-104C, a first gate layer 110A, and a second gate layer 110B.

In embodiments, the substrate 102 can be a base structure on which various components of the semiconductor structure 100A are positioned on. In embodiments, the substrate 102 can be a portion of a silicon wafer. For example, in embodiments, the substrate 102 could be an insulator layer of an SOI (silicon on insulator) wafer.

The set of semiconductor fins 104A-104C can be formed on the substrate 102. The set of semiconductor fins 104A-104C can be constructed from various materials. For example, in embodiments the set of semiconductor fins 104A-104C can be constructed from silicon. In some embodiments, the set of semiconductor fins 104A-104C could be constructed from silicon-germanium, or other suitable material. In embodiments, portions of the set of semiconductor fins 104A-104C can be doped to create source, drain, and/or channel regions in the set of semiconductor fins 104A-104C. In some embodiments, the set of semiconductor fins 104A-104C can be transistor fins for FinFETs or other suitable devices.

As seen in FIG. 1A, the set of semiconductor fins 104A-104C can be positioned on the substrate 102 approximately parallel lengthwise to one another. In embodiments, being positioned approximately parallel lengthwise means being positioned parallel within standard semiconductor manufacturing tolerances. The set of semiconductor fins 104A-104C have various dimensions including a fin width 106, a fin height 107 and can be separated from one another by a fin distance 108. The fin width 106, the fin height 107, and the fin distance 108 can be selected as various value. For example, the dimensions can depend upon the technology node of the semiconductor structure 100A (5 nm, 10 nm, 14 nm, 20 nm, 22 nm, etc.), or on other factors. In some embodiments, the technology node of the semiconductor structure could be within a range of nodes including 5 nm to 45 nm technology nodes. In some embodiments, the fin width 106, the fin height 107, and the fin distance 108 can be proportional to one another. For example, fin width 106 could be variable R, fin height 107 could be 2R, and fin distance 108 could be 1.5R.

As seen in FIG. 1A, three semiconductor fins 104A-104C are shown. In embodiments, various numbers of semiconductor fins 104A-104C can be used. For example, in embodiments the set of semiconductor fins could include a single semiconductor fin. In some embodiments, the set of semiconductor fins could include greater than three fins.

The first and second gate layers 110A, 110B can be material deposited on the substrate 102 and on the set of semiconductor fins 104A-104C. In embodiments, the first gate layer 110A and second gate layer 110B can be transistor gates that, along with the set of semiconductor fins 104A-104C, can be used to form a set of FinFETs. Described further herein, the first gate layer 110A and second gate layer 110B can be constructed using standard transistor manufacturing techniques, such as masking, epitaxial growth, and planarization. As seen in FIG. 1A, for clarity, the first gate layer 110A and second gate layer 110B are reduced in scale to improve visibility of components in the semiconductor structure 100A.

The first gate layer 110A can have a first gate width 111A and the second gate layer 110B can have a second gate width 111B. The first gate width 111A and second gate width 111B can be selected as various values. For example, the first and second gate widths 111A, 111B can depend upon the technology node of the structure 100A (5 nm, 10 nm, 14 nm, 20 nm, 22 nm, etc.), or on other factors. For example, in embodiments, the first and second gate widths 111A, 111B can be 20 nm. The first and second gate layers 110A, 110B can have a gate distance 112 separating each of the gate layers from one another. In embodiments, the gate distance 112 can be selected as various values. For example, in embodiments, the gate distance could be 60 nm. In some embodiments, the gate distance can be proportional to the first and second gate widths 11BA, 111B. For example, in embodiments, the first and second gate widths 111A, 111B could be variable P and the gate distance could be a value equal to 3P.

In embodiments, the first and second gate layers 110A, 110B are deposited on the substrate 102 and on each of the set of semiconductor fins 104A-104C approximately perpendicular, lengthwise, to the set of semiconductor fins 104A-104C. In embodiments, being positioned approximately perpendicular lengthwise means being positioned perpendicular within standard semiconductor manufacturing tolerances. The first and second gate layers 110A, 110B can be positioned approximately parallel with one another in the semiconductor structure 100A. In embodiments, being positioned approximately parallel means being positioned parallel within standard semiconductor manufacturing tolerances. The first and second gate layers 110A, 110B can be positioned such that they directly contact sidewalls of each of the set of semiconductor fins 104A-104C. In embodiments, the gate layers traversing the semiconductor fins 104A-104C occupy approximately 25% of the fin sidewalls. In embodiments, these sidewalls can contain roughly 80% of the exposed semiconductor fin surface area (with height 2R and fin width R). In some instances, such as in structure 100A, the space between gate material regions (the remaining ¾ of the fin sidewall) is not utilized for capacitance potential.

In embodiments, the first gate layer 110A and the second gate layer 110B can include a dielectric layer directly on the substrate 102 and on the set of semiconductor fins and a poly-silicon layer directly on the first dielectric layer. For example, the first gate layer 110A can include a first poly-silicon layer 114A and a first dielectric layer 116A. The second gate layer 110B can include a second poly-silicon layer 114B and a second dielectric layer 116B.

In embodiments, various numbers of gate layers can be deposited on the set of semiconductor fins 104A-104C. For example, in embodiments, the semiconductor structure 100A could include a third gate layer deposited on the semiconductor fins 104A-104C approximately parallel with the first and second gate layers 110A, 110B.

Figure 1B:
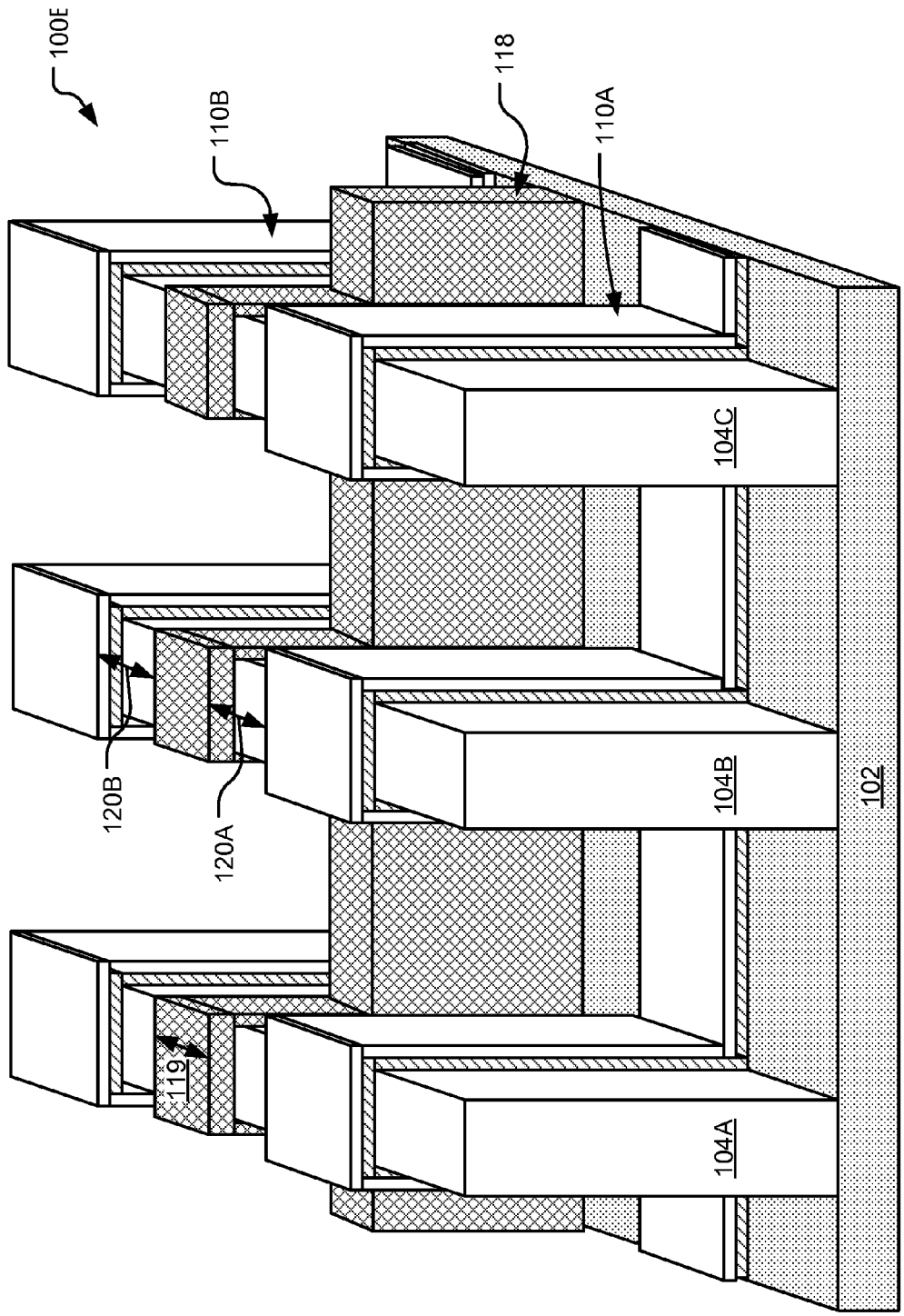

Referring now to FIG. 1B a perspective view of a semiconductor structure 100B can be seen according to embodiments of the present disclosure. The semiconductor structure 100B can include a substrate 102, a set of semiconductor fins 104A-104C, a first and second gate layer 110A, 110B, and an interconnect layer 118.

The substrate 102, the set of semiconductor fins 104A-104C, and the first and second gate layers 110A, 110B can be the same or substantially similar as described herein. The interconnect layer 118 can be a local "wire" deposited on the substrate 102 and on the set of semiconductor fins 104A-104C. In embodiments, the interconnect layer 118 can electrically tie each of the semiconductor fins 104A-104C together, which can reduce the need for metal wiring to each fin. In embodiments, the interconnect layer 118 can be constructed from metal. For example, in embodiments, the interconnect layer 118 is constructed from tungsten. In some embodiments, the interconnect layer 118 can be constructed from other suitable conductive material.

In embodiments, the interconnect layer 118 can have dimensions including an interconnect width 119 and can be positioned on the substrate 102 between the first gate layer 110A and the second gate layer 110B. In embodiments, the interconnect width 119 can be selected as various values less than the gate distance 112 (FIG. 1A). In embodiments, the interconnect layer 118 can be positioned between the first gate layer 110A and the second gate layer 110B at a first interconnect distance 120A from the first gate layer 110A and a second interconnect distance 120B from the second gate layer 110B. In embodiments, the first interconnect distance 120A and the second interconnect distance 120B can be approximately equal. In embodiments, being approximately parallel lengthwise means being equal within standard semiconductor manufacturing tolerances.

As seen in FIG. 1B, the interconnect layer 118 can be positioned approximately perpendicular, lengthwise, to the set of semiconductor fins, and can be deposited to directly contact sidewalls of each of the set of semiconductor fins 104A-104C. In embodiments, being positioned approximately perpendicular lengthwise means being positioned perpendicular within standard semiconductor manufacturing tolerances.

As seen in FIG. 1B, for clarity, the first gate layer 110A, second gate layer 110B and the interconnect layer 118 are reduced in scale to improve visibility of components in the semiconductor structure 100B.

Figure 1C:
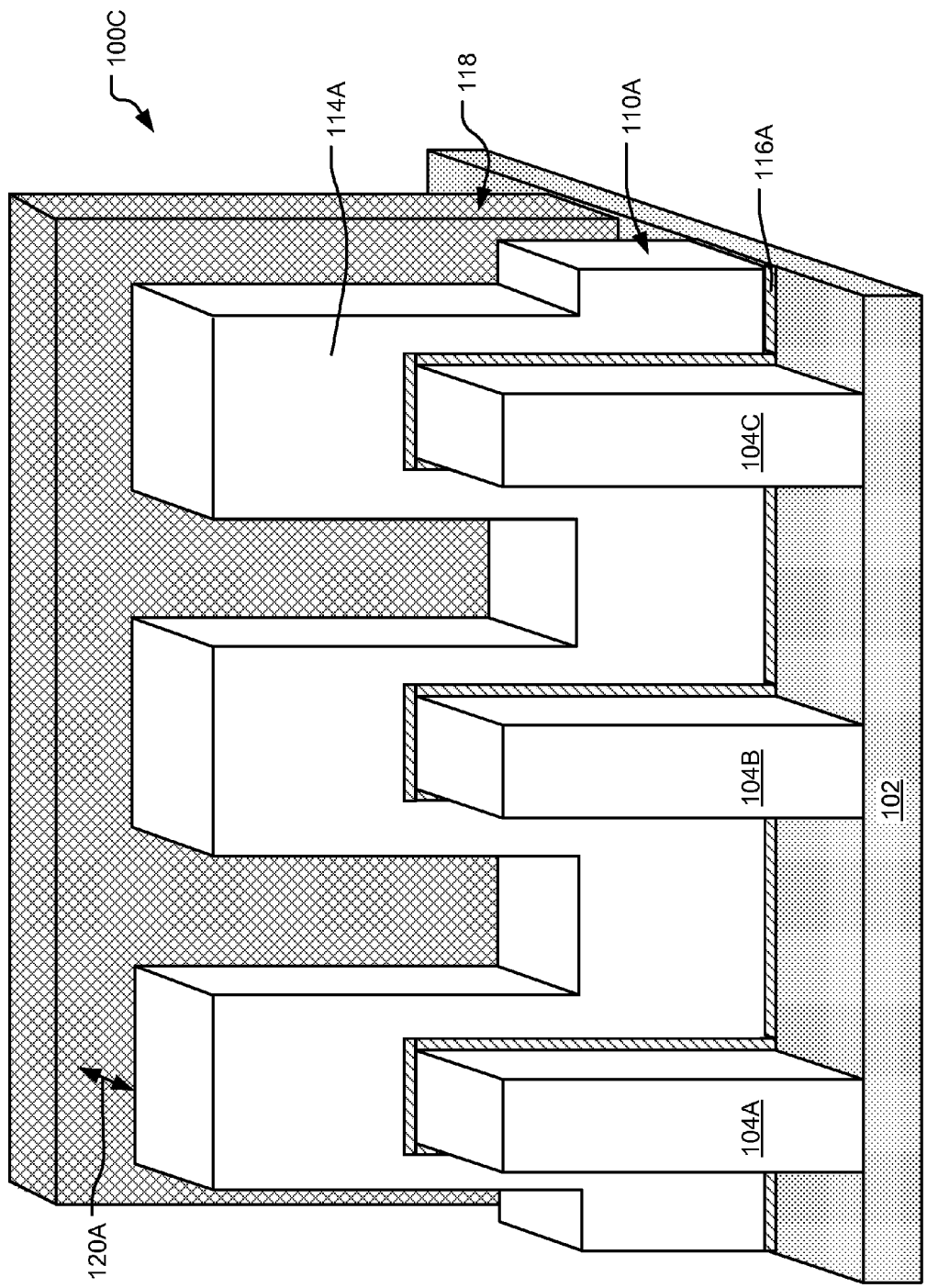

Referring now to FIG. 1C a perspective view of a semiconductor structure 100C can be seen according to embodiments of the present disclosure. The semiconductor structure 100C can include a substrate 102, a set of semiconductor fins 104A-104C, a first gate layer 110A and an interconnect layer 118. The substrate 102, the set of semiconductor fins 104A-104C, the first gate layer 104A, and the interconnect layer 118 can be the same or substantially similar as described herein.

In contrast to FIGS. 1A and 1B, the first gate layer 110A and the interconnect layer can be seen in FIG. 1C drawn to an example scale, according to embodiments of the present disclosure. Thus, in FIG. 1C, a second gate layer such as the second gate layer 110B (FIG. 1B), can be located on the substrate 102 behind the interconnect layer 118.

The interconnect layer 118 can be positioned between the first gate layer 110A and the second gate layer as described herein. For example, the interconnect layer 118 can be positioned a first interconnect distance 120A from the first gate layer 110A.

In embodiments, the height of the interconnect layer 118 and the height of the gate layers, such as the first gate layer 110A, is different. For example, in embodiments, the interconnect layer 118 can have a height greater than the height of the first gate layer 110A. In some instances, differing heights could be used to ease making electrical contacts to the gate metal and/or the interconnect layer 118. In some embodiments, the interconnect layer 118 and the first gate layer 110 can have approximately the same height.

As seen in FIG. 1C, there can be a large facing area between the interconnect layer 118 and each of the adjacent gate layer's side and top surfaces. For example, the interconnect layer 118 has a facing layer between sidewalls of the first gate layer 110A opposing the interconnect layer 118. Similarly, the interconnect layer 118 can have the same or substantially similar facing layers with the second gate layer.

In embodiments, the dielectric thickness between the interconnect layer 118 and each of the gate layers can be on approximately ten times that of the gate dielectric, such as first dielectric layer 116A traversing the set of semiconductor fins 104A-104C. Further, in embodiments, the facing area between the interconnect layer 118 and the gate layers (such as the first gate layer 110A) can be approximately twice as large as a facing area from the gate layers (such as the first gate layer 110A) to the set of semiconductor fins 104A-104C. Thus, the capacitance of the semiconductor structure 100C can be increased, relative to other structures, such as structure 100A (FIG. 1A). For example, in embodiments, capacitance of the structure 100C can be increased due to fringing capacitance between the interconnect layer 118 and the first gate layer 110A, including the first polysilicon layer 114A and the first dielectric layer 116A. In some embodiments, capacitance can be increased by 30% relative to other structures. Additionally, resistance and wiring congestion can be improved.

Additionally, since capacitance exists on both sides of the interconnect 118, from the first gate layer 110A and the second gate layer, multiple sides of the structure 100C can be active signals (e.g. not tied to power supplies).

Described further herein, in embodiments, an oxide layer could be deposited on the substrate 102 and enclose elements of the semiconductor structure 100C. As seen in FIG. 1C, the oxide layer is omitted for clarity in viewing the elements of the semiconductor structure.

In some embodiments, a second interconnect layer could be added along with the additional gate layer. For example, if a third gate layer was positioned between the first and second gate layers, a first interconnect layer could be positioned between the first and third gate layer. Similarly, a second interconnect layer could be positioned between the second and third gate layer.

Referring now to FIG. 2A a top view 200A of a stage of forming a semiconductor structure can be seen according to embodiments of the present disclosure. The top view 200A can include a substrate 202, and a set of semiconductor fins 204A-204C. The substrate 202 and the set of semiconductor fins 204A-204C can be the same or substantially similar as described herein. The set of semiconductor fins 204A-204C can be formed using standard semiconductor manufacturing techniques.

Figure 2B:
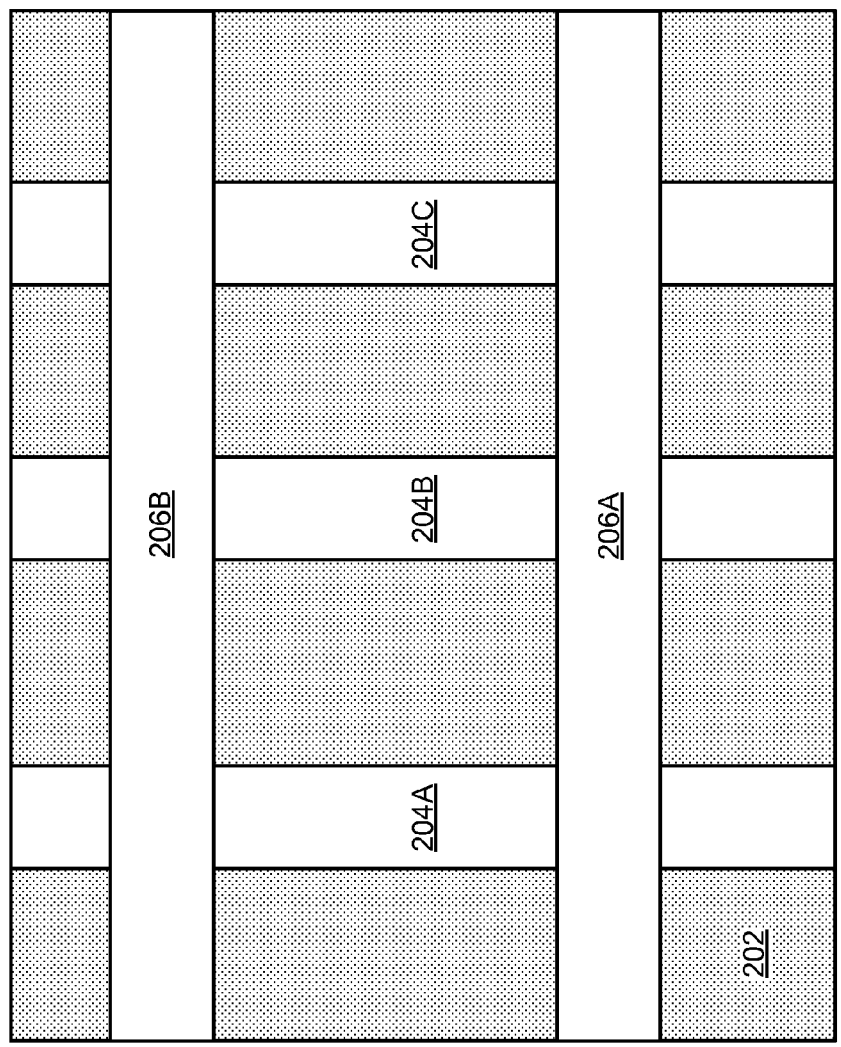

Referring now to FIG. 2B a top view 200B of a stage of forming a semiconductor structure can be seen according to embodiments of the present disclosure. The top view 200B can include a substrate 202, a set of semiconductor fins 204A-204C, a first gate layer 206A, and a second gate layer 206B. The substrate 202 and the set of semiconductor fins 204A-204C can be the same or substantially similar as described herein. The first gate layer 206A and the second gate layer 206B can be the same or substantially similar as described herein. In embodiments, the first gate layer 206A and the second gate layer 206B can be transistor fins, as described herein. In embodiments, the first and second gate layers 206A, 206B can be formed on the substrate 202 and the set of semiconductor fins 204A-204C using standard FinFET manufacturing techniques.

Figure 2C:
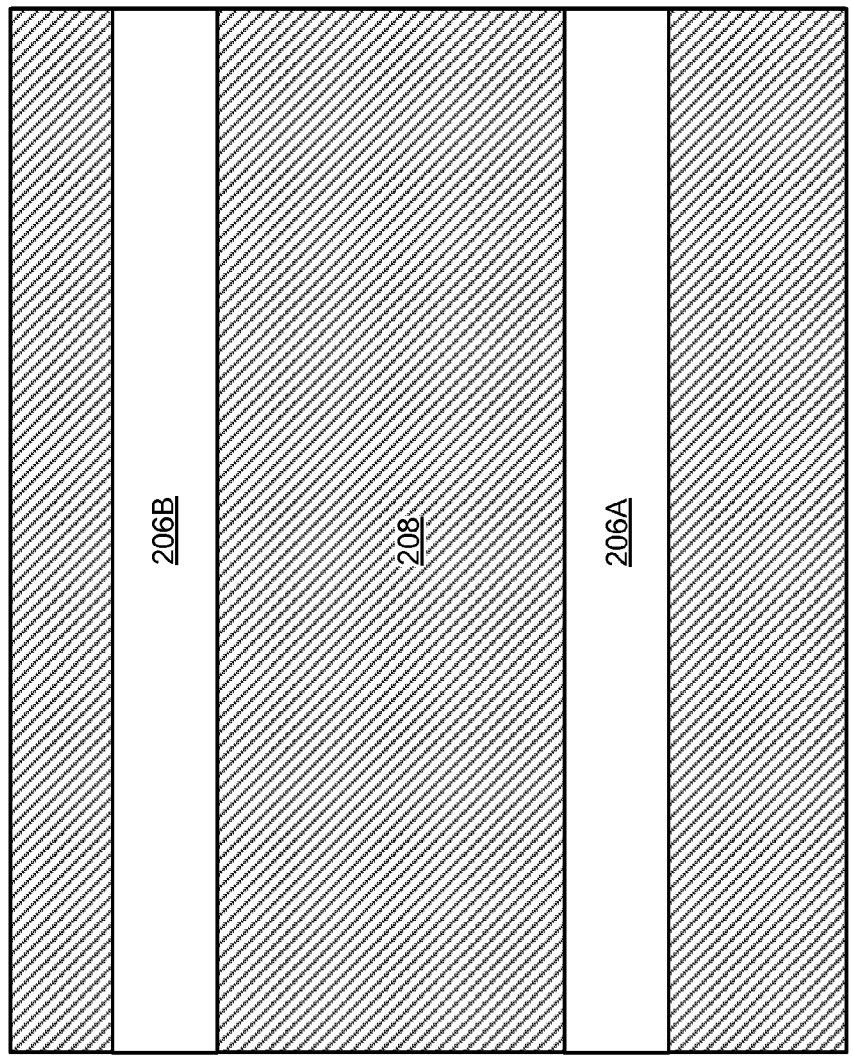

Referring now to FIG. 2C a top view 200C of a stage of forming a semiconductor structure can be seen according to embodiments of the present disclosure. The top view can include an oxide layer 208, a first gate layer 206A, and a second gate layer 206B. The first and second gate layers 206A, 206B can be the same or substantially similar as described herein. In embodiments, the oxide layer 208 can be formed by depositing oxide on a substrate 202 (FIG. 2B), on a set of semiconductor fins 204A-204C (FIG. 2B), and the first and second gate layers 206A, 206B. In embodiments, after depositing, the oxide can be planarized by etching the layer down to reveal a portion of the first and second gate layers 206A, 206B. In some embodiments, the oxide layer 208 can be left without planarization, such that the layer encloses the first and second gate layers 206A, 206B. In embodiments the revealed portion of the one or more gate layers 206A, 206B can include one or more peaks of the gate layers. For example, the one or more peaks can be portions of the gate layers that sit disposed on each of the semiconductor fins. In some embodiments, the revealed portion can include the top sidewall of the gate layers, such as the one or more peaks and the top sidewall of the gate layer between the one or more peaks.

Figure 2D:
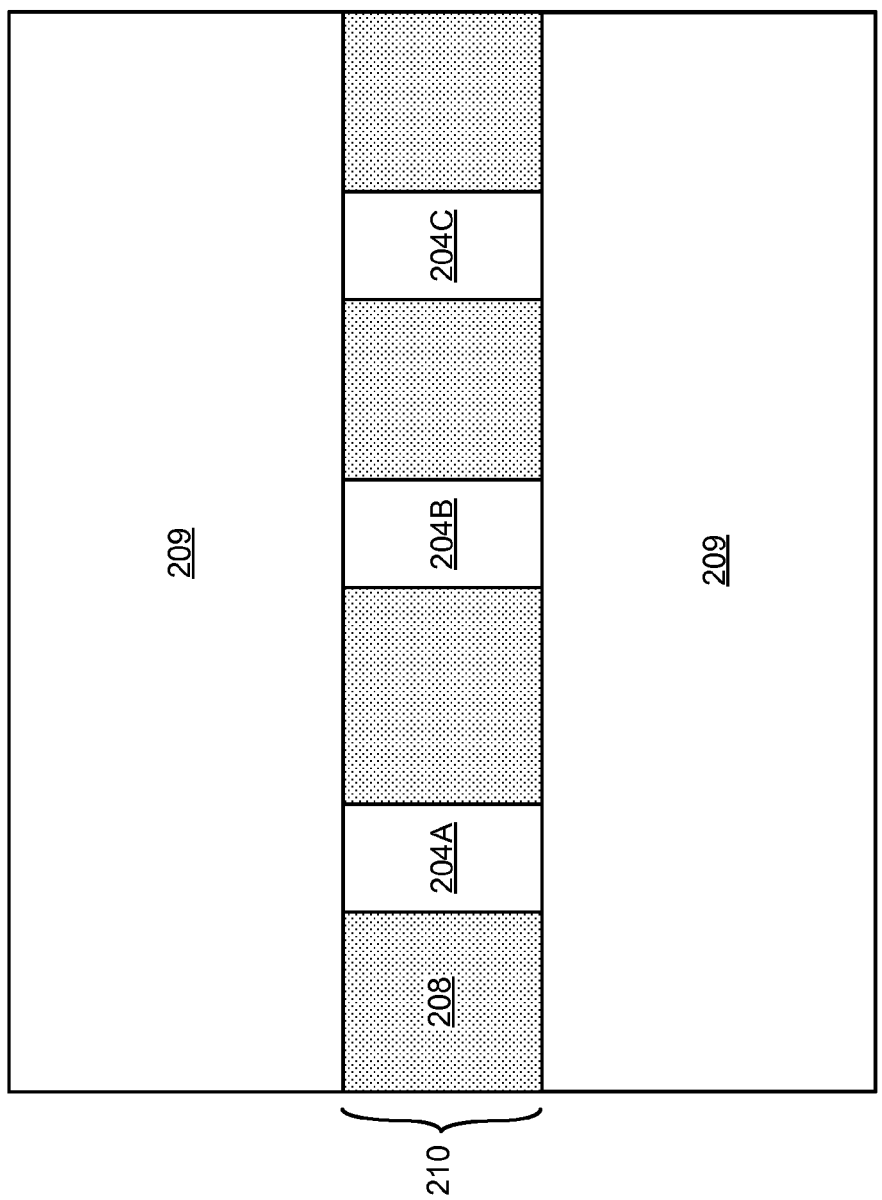

Referring now to FIG. 2D a top view 200D of a stage of forming a semiconductor structure can be seen according to embodiments of the present disclosure. The top view 200D can include a substrate 202, a set of semiconductor fins 204A-204C within a channel 210, and a mask layer 209.

In embodiments, the first and second gate layers 206A, 206B and the oxide layer 208 (FIG. 2C) can be masked, leaving a channel 210 of oxide material unmasked in the semiconductor structure. After masking, the oxide layer 208 (FIG. 2C) can be etched down to expose the substrate 202 and the set of semiconductor fins 204A-204C. In some embodiments, the oxide 208 can be etched completely away in the channel 210 to reveal the substrate 202. In some embodiments, a portion of the oxide layer 208 (FIG. 2C) can be removed. In embodiments, etching away the oxide layer can improve contact of interconnect material deposited in the channel 210, as described herein.

Figure 2E:
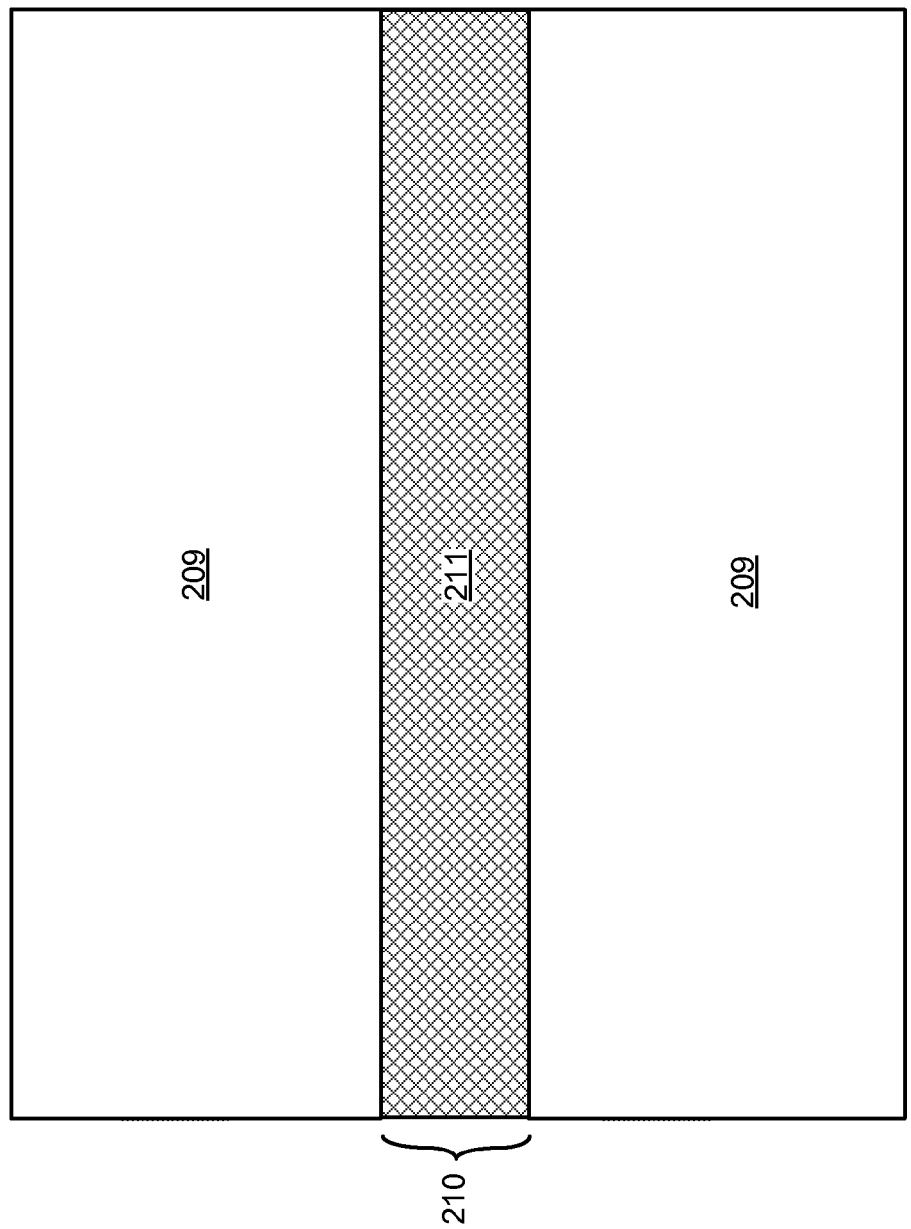

Referring now to FIG. 2E a top view 200E of a stage of forming a semiconductor structure can be seen according to embodiments of the present disclosure. Top view 200E shows a mask layer 209 and an interconnect layer 211 in channel 210. The interconnect layer can be the same or substantially similar as described herein. In embodiments, the interconnect layer can be formed in the channel using standard semiconductor manufacturing techniques.

Figure 2F:
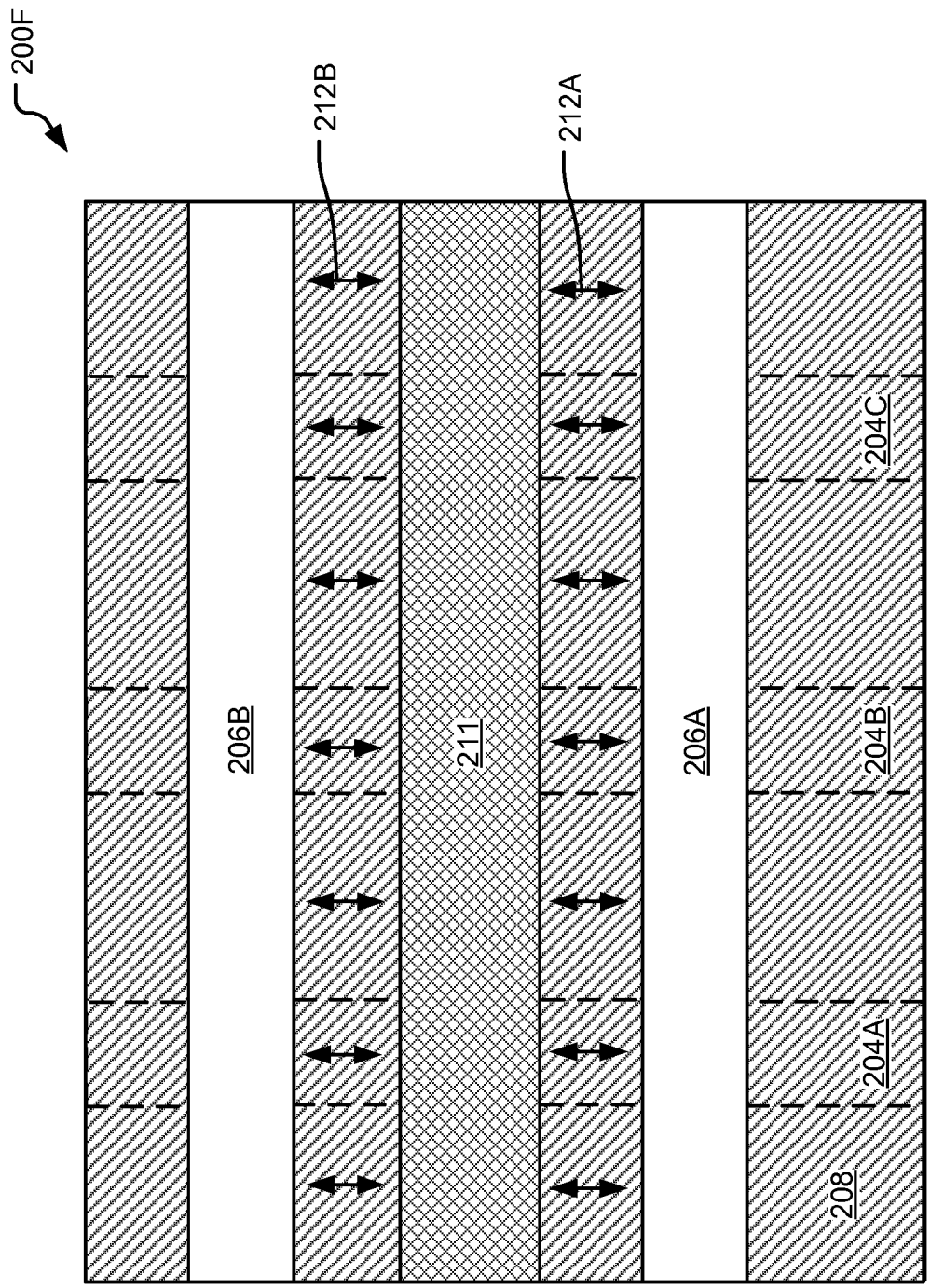

Referring now to FIG. 2F a top view 200F of a stage of forming a semiconductor structure can be seen according to embodiments of the present disclosure. The top view 200F can include an oxide layer 208, a first gate layer 206A, a second gate layer 206B, and an interconnect layer 211. A set of semiconductor fins 204A-204C (FIG. 2D) can be seen in top view 200F represented by dotted lines indicating their presence within the oxide layer 208.

First capacitance 212A can be seen between the first gate layer 206A and the interconnect layer 211. Similarly, second capacitance 212B can be seen between the second gate layer 206B and the interconnect layer 211.

As described herein, In embodiments, the dielectric thickness between the interconnect layer 118 and each of the gate layers can be on approximately ten times that of a gate dielectric, such in the first and second gate layers 206A, 206B. Further, as described herein, a facing area between the interconnect layer 118 and the gate layers can be approximately twice as large as a facing area from the gate layers to the set of semiconductor fins 204A-204C (FIG. 2D). Thus, the capacitance of the semiconductor structure seen in 200F can be increased, relative to other structures. In embodiments, the first capacitance 212A and the second capacitance 212B can be used for dedicated signal capacitance. In some embodiments, the first capacitance 212A and the second capacitance 212B can be used for power supply decoupling.

Figure 3:
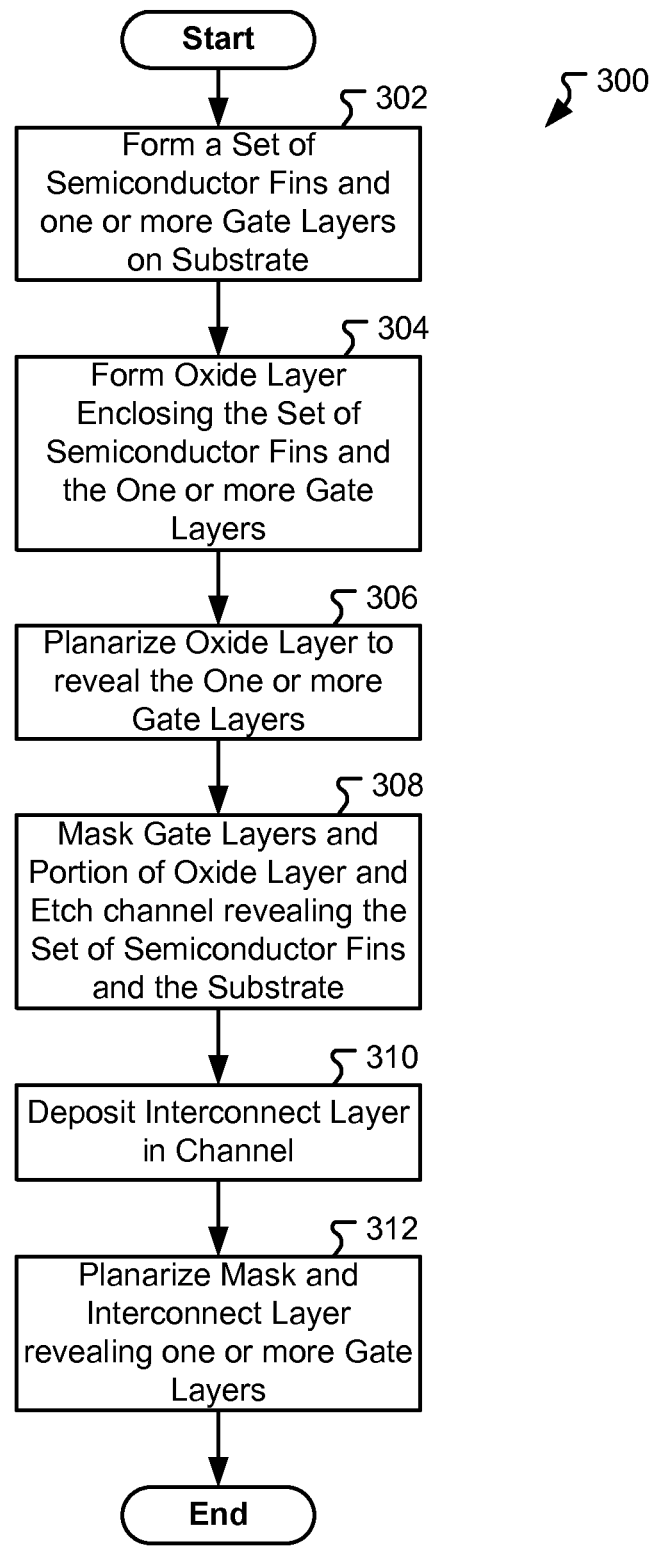
FIG. 3 depicts a flowchart diagram of a method of forming a semiconductor structure, according to embodiments of the present disclosure.

Referring now to FIG. 3 a flowchart diagram of a method 300 of forming a semiconductor structure can be seen, according to embodiments of the present disclosure. In operation 302, the method 300 can include forming a set of semiconductor fins and one or more gate layers on a substrate. The set of semiconductor fins and one or more gate layers can be formed using standard semiconductor manufacturing techniques as described herein. In operation 304, the method 300 can include forming an oxide layer enclosing the set of semiconductor fins and the one or more gate layers. The oxide layer can be the same or substantially similar as described herein. In embodiments, the oxide layer can improve electrical isolation of various components of the semiconductor structure, described further herein. In operation 306, the method 300 can include planarization of the oxide layer to reveal a portion of the one or more gate layers. In embodiments the revealed portion of the one or more gate layers can include one or more peaks of the gate layers. The one or more peaks can the portions of the gate layers that sit disposed on each of the semiconductor fins. In some embodiments, the revealed portion can include the top sidewall of the gate layers, such as the one or more peaks and the top sidewall of the gate layer between the one or more peaks.

In embodiments, the one or more gate layers can be revealed to make electrical contact with the gates, as described herein. In embodiments, operation 304 and 306 can be performed prior to forming the interconnect layer to allow for creation of a channel in which the interconnect layer is formed.

In operation 308, the method 300 can include masking the gate layers and masking portions of the oxide layer to define a channel of unmasked oxide. Additionally, in operation 308, the method can include etching the channel to reveal the set of semiconductor fins and the substrate. In embodiments, the unmasked oxide can be etched using an oxide etch. In operation 310, the method 300 can include depositing the interconnect layer in the channel. In operation 312, the method 300 can include planarizing the mask and the interconnect layer to reveal the one or more gate layers.

Figure 4:
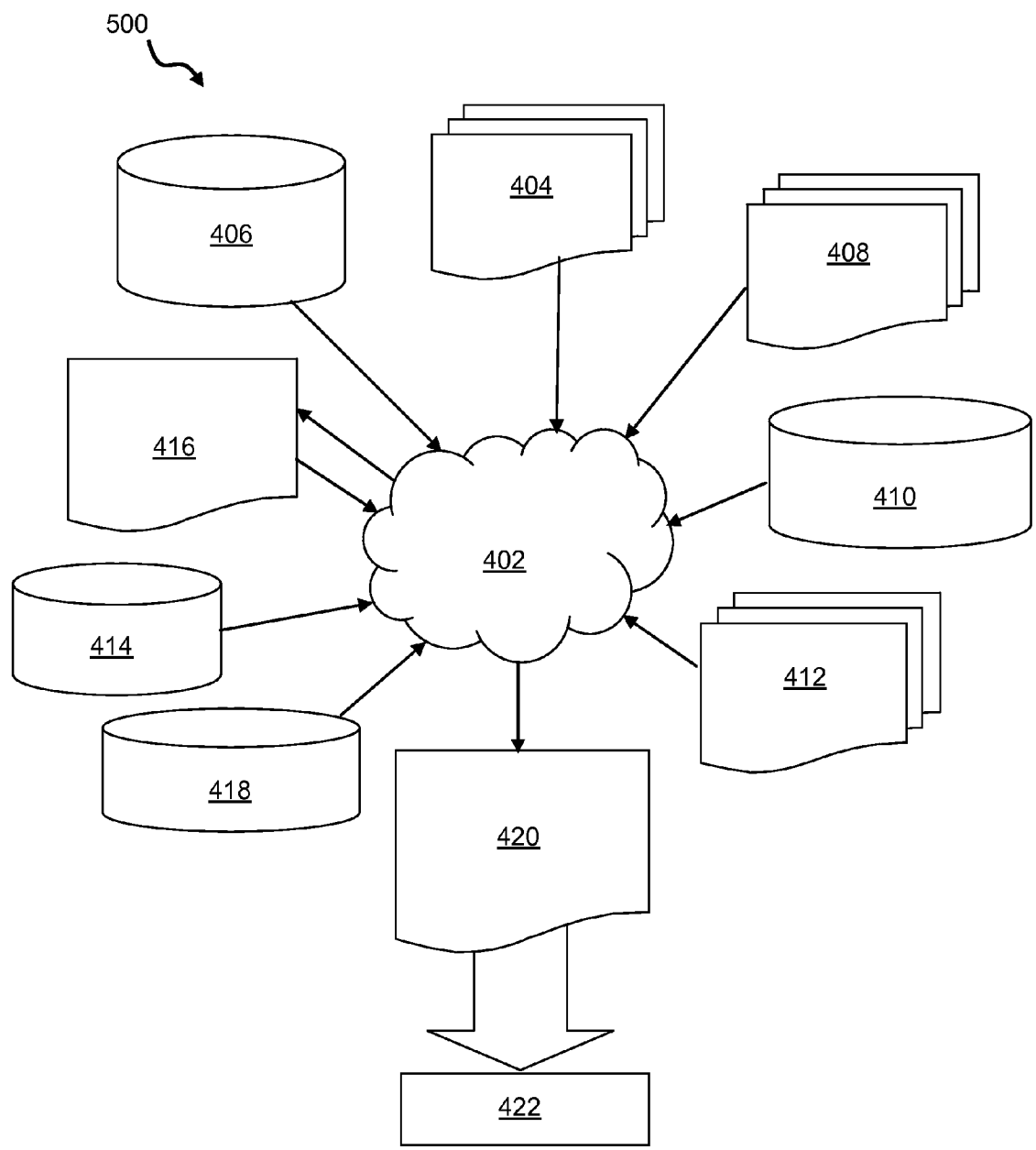
FIG. 4 is a flow diagram of a design process used in semiconductor design, manufacture, and/or test.

FIG. 4 shows a block diagram of an exemplary design flow 400 used for example, in semiconductor integrated circuit (IC) logic design, simulation, test, layout, and manufacture. Design flow 400 includes processes, machines and/or mechanisms for processing design structures or devices to generate logically or otherwise functionally equivalent representations of the design structures and/or devices described and shown herein.

The design structures processed and/or generated by design flow 400 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 400 may vary depending on the type of representation being designed. For example, a design flow 400 for building an application specific IC (ASIC) may differ from a design flow 400 for designing a standard component or from a design flow 400 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 404 that is preferably processed by a design process 402. Design structure 404 may be a logical simulation design structure generated and processed by design process 402 to produce a logically equivalent functional representation of a hardware device. Design structure 404 may also or alternatively comprise data and/or program instructions that when processed by design process 402, generate a functional representation of the physical structure of a hardware device. Whether representing functional and/or structural design features, design structure 404 may be generated using electronic computer-aided design (ECAD) such as implemented by a core developer/designer.

When encoded on a machine-readable data transmission, gate array, or storage medium, design structure 404 may be accessed and processed by one or more hardware and/or software modules within design process 402 to simulate or otherwise functionally represent an electronic component, circuit, electronic or logic module, apparatus, device, or system such as described herein. As such, design structure 404 may comprise files or other data structures including human and/or machine-readable source code, compiled structures, and computer-executable code structures that when processed by a design or simulation data processing system functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 402 preferably employs and incorporates hardware and/or software modules for synthesizing, translating, or otherwise processing a design/simulation functional equivalent of the components, circuits, devices, or logic structures shown herein to generate a Netlist 416 which may contain design structures such as design structure 404. Netlist 416 may comprise, for example, compiled or otherwise processed data structures representing a list of wires, discrete components, logic gates, control circuits, I/O devices, models, etc. that describes the connections to other elements and circuits in an integrated circuit design. Netlist 416 may be synthesized using an iterative process in which netlist 416 is resynthesized one or more times depending on design specifications and parameters for the device. As with other design structure types described herein, netlist 416 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 402 may include hardware and software modules for processing a variety of input data structure types including Netlist 416. Such data structure types may reside, for example, within library elements 406 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 408, characterization data 410, verification data 412, design rules 414, and test data files 418 which may include input test patterns, output test results, and other testing information. Design process 402 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 402 without deviating from the scope and spirit of the invention. Design process 402 may also include modules for performing standard circuit design processes such as timing analysis, verification, design rule checking, place and route operations, etc. Design process 402 employs and incorporates logic and physical design tools such as HDL compilers and simulation model build tools to process design structure 404 together with some or all of the depicted supporting data structures along with any additional mechanical design or data (if applicable), to generate a second design structure 420. Design structure 420 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures).

Similar to design structure 404, design structure 420 preferably comprises one or more files, data structures, or other computer-encoded data or instructions that reside on transmission or data storage media and that when processed by an ECAD system generate a logically or otherwise functionally equivalent form of one or more of the embodiments of the invention shown herein. In one embodiment, design structure 420 may comprise a compiled, executable HDL simulation model that functionally simulates the devices shown in herein.

Design structure 420 may also employ a data format used for the exchange of layout data of integrated circuits and/or symbolic data format (e.g. information stored in a GDSII (GDS2), GL1, OASIS, map files, or any other suitable format for storing such design data structures). Design structure 420 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described and shown herein. Design structure 420 may then proceed to a stage 422 where, for example, design structure 420: proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of forming a semiconductor structure comprising:

forming a set of semiconductor fins on a substrate, the set of semiconductor fins positioned approximately parallel lengthwise to one another, each of the set of semiconductor fins separated from one another by a fin distance;

forming a first gate layer having a first gate width, the first gate layer deposited on the substrate and on the set of semiconductor fins approximately perpendicular lengthwise to the set of semiconductor fins, the first gate layer directly contacting sidewalls of each of the set of semiconductor fins;

forming a second gate layer having a second gate width, the second gate layer deposited on the substrate and on the set of semiconductor fins approximately perpendicular lengthwise to the set of semiconductor fins, the second gate layer directly contacting sidewalls of each of the set of semiconductor fins, the first gate layer and the second gate layer positioned approximately parallel with one another and separated by a gate distance; and forming an interconnect layer deposited on the substrate and on the set of semiconductor fins approximately perpendicular lengthwise to the set of semiconductor fins, the interconnect layer directly contacting sidewalls of each of the set of semiconductor fins, the interconnect layer positioned between the first gate layer and the second gate layer at a first interconnect distance from the first gate layer and a second interconnect distance from the second gate layer.

2. The method of claim 1, further comprising:
forming, prior to forming the interconnect layer, an insulator layer directly on the substrate, on the set of semiconductor fins, and on the first and second gate layers;
planarizing, prior to forming the interconnect layer, the insulator layer down to the first and second gates to reveal a portion of the first and second gates.

3. The method of claim 2, wherein:
forming the interconnect layer includes:
   masking the first and second gate layers, masking a portion of the insulator layer, and leaving unmasked a channel, the channel positioned between the first and second gates and having a width approximately equal to an interconnect width of the interconnect layer;
   etching the insulator layer in the channel to reveal a portion of the set of semiconductor fins and the substrate; and
   forming the interconnect layer on the substrate and the set of semiconductor fins in the channel.

4. The method of claim 1, wherein:
the first interconnect distance and the second interconnect distance are approximately equal.

5. The method of claim 1, wherein:
the interconnect layer is constructed from conductive material, the conductive material electrically connecting each of the set of semiconductor fins.

6. The method of claim 1, wherein:
the first gate layer includes a first dielectric layer directly on the substrate and on the set of semiconductor fins and a first poly-silicon layer directly on the first dielectric layer.

7. The method of claim 1, wherein:
the semiconductor structure is constructed according to a technology node approximately in a range of 5 nanometers to 45 nanometers.

8. The method of claim 1, wherein:
The set of semiconductor fins each have dimensions including a fin width and a fin height, wherein fin height is approximately twice as large as the fin width and the fin distance is approximately one and a half times the fin width.

9. The method of claim 1, wherein:
the first gate width and the second gate width are approximately equal, and the gate distance is a value approximately three times the first gate width.

* * * * *